US012777713B2

(12) United States Patent
Liu et al.

(10) Patent No.: US 12,777,713 B2
(45) Date of Patent: Oct. 27, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Hongyan Liu, Wuhan (CN); Tao Chen, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 402 days.

(21) Appl. No.: 18/686,885

(22) PCT Filed: Jan. 24, 2024

(86) PCT No.: PCT/CN2024/073757

§ 371 (c)(1),
(2) Date: Feb. 27, 2024

(87) PCT Pub. No.: WO2025/138373

PCT Pub. Date: Jul. 3, 2025

(65) Prior Publication Data

US 2025/0248119 A1 Jul. 31, 2025

(30) Foreign Application Priority Data

Dec. 29, 2023 (CN) ........................ 202311868188.7

(51) Int. Cl.

| | |
|---|---|
| ***H10D 86/40*** | (2025.01) |
| ***H10D 86/60*** | (2025.01) |
| *G09G 3/3225* | (2016.01) |

(52) U.S. Cl.

CPC ........... *H10D 86/441* (2025.01); *H10D 86/60* (2025.01); *G09G 3/3225* (2013.01); (Continued)

(58) Field of Classification Search

CPC .... H10D 86/441; H10D 86/60; H10D 86/423; H10D 30/6729; G09G 3/3225; (Continued)

(56) References Cited

U.S. PATENT DOCUMENTS

2025/0081768 A1* 3/2025 Li ........................ H10K 59/131
2025/0157401 A1* 5/2025 Long .................... G09G 3/3233

FOREIGN PATENT DOCUMENTS

KR 20210096583 A * 8/2021 ........... G09G 3/3233

* cited by examiner

*Primary Examiner* — Sitaramarao S Yechuri
(74) *Attorney, Agent, or Firm* — PV IP PC; Wei Te Chung

(57) ABSTRACT

A display panel and a display device are provided. The display panel includes two pixel driving circuits that are adjacently and symmetrically arranged. Each pixel driving circuit is electrically connected to a data line. Between the two data lines corresponding to the two pixel driving circuits, two first power signal lines are placed, and a second connection line is arranged between the two first power signal lines. This arrangement effectively eliminates the interference problem between the second connection line and the first power signal line, and reduces the difficulty in connecting the first connection line and the second connection line.

20 Claims, 8 Drawing Sheets

(52) U.S. Cl.
CPC ............... *G09G 2300/0426* (2013.01); *G09G 2300/0852* (2013.01); *G09G 2310/08* (2013.01); *G09G 2320/0223* (2013.01); *H10D 86/423* (2025.01)

(58) Field of Classification Search
CPC ... G09G 2300/0426; G09G 2300/0852; G09G 2310/08; G09G 2320/0223; H10K 59/131
See application file for complete search history.

DISPLAY PANEL AND DISPLAY DEVICE

TECHNICAL FIELD

The present application relates to a field of display technology, and specifically to a display panel and a display device.

DESCRIPTION OF RELATED ART

Organic light-emitting diode (OLED) display panels, as compared to liquid crystal displays, offer several advantages such as being lighter and thinner, having better display quality, higher resolution, wider color gamut, lower power consumption, and the ability to achieve flexible displays. These advantages have led to their rapid development in recent years, making them the preferred display panel type for mobile devices.

Currently, to improve the display effect at the edges, researchers have developed an architecture called "Fanout in Active Area" (FIAA), which involves using fan-out wiring in a display area to connect the data lines of an edge display area with the fan-out wiring in the non-display area. The fan-out wiring in the display area usually includes a first connection line which extends in a different direction than the data lines, and a second connection line which extends in the same direction as the data lines. To mitigate the screen-off mura issue, it is common to set the first and second connection lines in different metal layers. For example, the first connection line can be disposed in a first metal layer that includes sources and drains of transistors, while the second connection line is disposed in a second metal layer. Additionally, to avoid interference issues between the second connection line and a block structure of a first power signal line, the first power signal line is set in an independent metal layer. To meet the design needs of the first power signal line, it is usually placed adjacent to the first metal layer, resulting in the first power signal line being set in a third metal layer between the first and second metal layers. Therefore, there is a gap between the first and second connection lines, consisting of the mentioned third metal layer and at least two insulating layers. This arrangement significantly increases the difficulty of connecting the first and second connection lines, and this issue urgently needs to be resolved.

SUMMARY OF INVENTION

The present application provides a display panel and a display device that can eliminate the interference issue between a second connection line in the fan-out wiring of the display area and a first power signal line, while also improving the increased difficulty in connecting a first connection line and the second connection line.

In a first aspect, the present application provides a display panel. The display panel includes a display area. The display panel includes: a substrate; a first source-drain metal layer, arranged on one side of the substrate, with a portion of the first source-drain metal layer located in the display area including a plurality of first connection lines extending in a first direction; a first planarization layer, arranged on a surface of the first source-drain metal layer opposite the substrate; a second source-drain metal layer, arranged on a surface of the first planarization layer opposite the substrate, with a portion of the second source-drain metal layer located in the display area including a plurality of data lines, a plurality of first power signal lines, and a plurality of second connection lines. The data lines, the first power signal lines, and the second connection lines all extending in a second direction. One of the second connection lines and one of the data lines are electrically connected to the same first connection line through via holes penetrating the first planarization layer. In the display area of the display panel, there are two pixel driving circuits set adjacently and symmetrically in the first direction, each electrically connected to one of the data lines. Between the two data lines corresponding to the two pixel driving circuits, two first power signal lines are disposed, and at least one of the second connection lines is arranged between the two first power signal lines.

In a second aspect, the present application provides a display device. The display device includes a housing and the display panel mentioned above. The housing includes an accommodation space, and the display panel is disposed in the accommodation space.

BRIEF DESCRIPTION OF DRAWINGS

To more clearly illustrate the technical solutions in the embodiments of the present application, the drawings required for the description of the embodiments are briefly introduced below. It is obvious that the drawings described below are just some of the embodiments of this application. For those skilled in the art, other drawings can also be obtained from these drawings without exerting creative effort.

Figure 1:
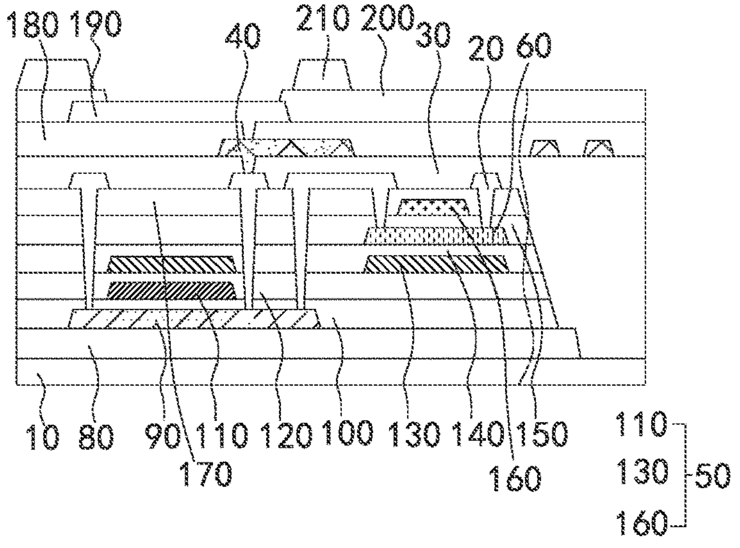
FIG. 1 is a schematic view of a film layer structure of a display panel according to some embodiments of the present application.

LIST OF REFERENCE LABEL display panel 01; display area 02; non-display area 03; substrate 10; first source-drain metal layer 20; first connection line 21; parallel signal line 22; first planarization layer 30; second source-drain metal layer 40; data line group 401; data line 41; first power signal line 42; second connection line 43; first part 431; second part 432; gate layer 50; first signal line 51; second signal line 52; metal oxide semiconductor layer 60; first active layer 61; second active layer 62; light-blocking metal layer 70; light-blocking section 71; buffer layer 80; low-temperature polysilicon semiconductor layer 90; first gate insulating layer 100; first gate layer 110; second-type scan line 111; second gate insulating layer 120; second gate layer 130; first interlayer dielectric layer 140; third gate insulating layer 150; third gate layer 160; shielding line 161; second interlayer dielectric layer 170; second planarization layer 180; anode layer 190; pixel defining layer 200; spacer layer 210; first thin-film transistor T1; second thin-film transistor T2; third thin-film transistor T3; fourth thin-film transistor T4; fifth thin-film transistor T5; Sixth thin-film transistor T6; Seventh thin-film transistor T7; eighth thin-film transistor T8; first capacitor C1; second capacitor C2; data signal input terminal DATA; gate reset signal line input terminal ViG; anode reset signal input terminal ViA; enable signal input terminal EM; first-type first scan signal input terminal Nscan1; first-type second scan signal input terminal Nscan2; second-type first scan signal input terminal Pscan1; second-type second scan signal input terminal Pscan2; second power signal input terminal VSS; edge region signal line M1; middle region signal line M2; first direction X; second direction Y; vertical bisecting line L1; pixel driving circuit XQ.

DETAILED DESCRIPTION OF EMBODIMENTS

In a first aspect, the present application provides a display panel. The display panel includes a display area. The display panel includes: a substrate; a first source-drain metal layer, arranged on one side of the substrate, with a portion of the first source-drain metal layer located in the display area including a plurality of first connection lines extending in a first direction; a first planarization layer, arranged on a surface of the first source-drain metal layer opposite the substrate; a second source-drain metal layer, arranged on a surface of the first planarization layer opposite the substrate, with a portion of the second source-drain metal layer located in the display area including a plurality of data lines, a plurality of first power signal lines, and a plurality of second connection lines. The data lines, the first power signal lines, and the second connection lines all extending in a second direction. One of the second connection lines and one of the data lines are electrically connected to the same first connection line through via holes penetrating the first planarization layer. In the display area of the display panel, there are two pixel driving circuits set adjacently and symmetrically in the first direction, each electrically connected to one of the data lines. Between the two data lines corresponding to the two pixel driving circuits, two first power signal lines are disposed, and at least one of the second connection lines is arranged between the two first power signal lines.

Optionally, the data lines in the portion of the second source-drain metal layer disposed in the display area are evenly divided into a plurality of data line groups, and each of the data line groups includes two adjacent data lines; wherein in at least one of the data line groups, two adjacent first power signal lines are disposed between the two data lines, and two adjacent second connection lines are disposed between the two first power signal lines.

Optionally, the display panel includes a non-display area and further includes: a gate layer, disposed between the substrate and the first source-drain metal layer, wherein a portion of the gate layer disposed in the non-display area includes a plurality of first signal lines, and the data lines are electrically connected to the first signal lines through the first connection lines and the second connection lines; wherein in a direction perpendicular to the substrate, a portion of the second source-drain metal layer disposed in the non-display area overlaps at least partially with the first signal lines, and a portion of the first source-drain metal layer disposed in the non-display area overlaps at least partially with the first signal lines; and a resistivity of the gate layer is greater than a resistivity of the first source-drain metal layer, and the resistivity of the gate layer is greater than a resistivity of the second source-drain metal layer.

Optionally, the display panel further includes: a metal oxide semiconductor layer, disposed between the substrate and the first source-drain metal layer, wherein a portion of the metal oxide semiconductor layer disposed in the display area includes a plurality of first active layers; the second connection line includes a first part and a second part, both the first part and the second part extending in the second direction; in a direction perpendicular to the substrate, at least a portion of the first part overlaps with the first active layer, while the second part avoids overlapping with the first active layer; and in the first direction, the first part possesses a first width, and the second part possesses a second width, with the first width being greater than the second width.

Optionally, the first power signal line is provided with a notch on one side close to the second connection line and at a position corresponding to the first part.

Optionally, the portion of the metal oxide semiconductor layer disposed in the display area further includes a plurality of second active layers, wherein in the direction perpendicular to the substrate, the first power signal lines cover the second active layers.

Optionally, the display panel further includes: a light-blocking metal layer, disposed on one side of the second source-drain metal layer facing away from the substrate; wherein the light-blocking metal layer includes a plurality of light-blocking sections, each of the light-blocking sections is electrically connected to two adjacent ones of the first power signal lines, and an orthographic projection of the light-blocking sections projected onto the second source-drain metal layer covers both the first active layers and the second active layers.

Optionally, the display panel further includes a plurality of first thin-film transistors and a plurality of second thin-film transistors disposed in the display area, wherein the first thin-film transistors include the first active layers, and the second thin-film transistors include the second active layers, wherein one of a source or a drain of each second thin-film transistor is electrically connected to a gate reset signal line, and the other one of a source or a drain of each second thin-film transistor is electrically connected to one of a source or a drain of one of the first thin-film transistors.

Optionally, the display panel further includes a low-temperature polysilicon (LTPS) semiconductor layer, and disposed in the display area, a plurality of third thin-film transistors, a plurality of fourth thin-film transistors, a plurality of fifth thin-film transistors, a plurality of sixth thin-film transistors, a plurality of seventh thin-film transistors, and a plurality of eighth thin-film transistors, wherein the LTPS semiconductor layer includes channels of the third thin-film transistors, channels of the fourth thin-film transistors, channels of the fifth thin-film transistors, channels of the sixth thin-film transistors, channels of the seventh thin-film transistors, and channels of the eighth thin-film transistors; and sources and drains of the third, thin-film transistors, the fourth thin-film transistors, the fifth thin-film transistors, the sixth thin-film transistors, the seventh thin-film transistors, and the eighth thin-film transistors are all located in the first source-drain metal layer.

Optionally, the display panel further includes a second-type scan line that is electrically connected to a gate of the seventh thin-film transistor and a gate of the eighth thin-film transistor, wherein in the direction perpendicular to the substrate, at least a portion of the second-type scan line overlaps with the first connection line, and wherein the display panel further includes a shielding line disposed between the second-type scan line and the first connection line.

Optionally, a width of the shielding line in the second direction is greater than widths of both the second-type scan line and the first connection line in the second direction.

Optionally, an orthographic projection of the second connection line projected onto the substrate covers orthographic projections of both the sixth thin-film transistor and the seventh thin-film transistors projected on the substrate.

Optionally, the first source-drain metal layer further includes a parallel signal line, and the parallel signal line is connected in parallel with the first power signal line.

Optionally, an area proportion of the parallel signal line in the first source-drain metal layer is greater than an area proportion of the first connection line in the first source-drain metal layer.

Optionally, a resistivity of the second source-drain metal layer is less than a resistivity of the first source-drain metal layer.

In a second aspect, the present application provides a display device. The display device includes a housing and any display panel mentioned above. The housing includes an accommodation space, and the display panel is disposed in the accommodation space.

The present application provides a display panel and a display device. In the display panel, as the portion of the second source-drain metal layer in the display area includes multiple data lines, multiple first power signal lines, and multiple second connection lines, these lines are arranged in the same layer, with only the first planarization layer separating the second connection lines from the first connection lines. This arrangement allows one of the second connection lines and one of the data lines to be electrically connected to the same first connection line, thereby forming a Fanout in Active Area (FIAA) architecture and effectively reducing the difficulty in connecting the first connection line and the second connection line. Additionally, this application employs a patterned design for the first power signal lines between two data lines under a specific pixel architecture. The specific pixel architecture consists of two pixel driving circuits that are adjacently and symmetrically set in the first direction, wherein the two pixel driving circuits are respectively electrically connected to the two data lines under the specific pixel architecture. By forming two first power signal lines between the two data lines corresponding to the two pixel driving circuits, this application utilizes a gap between the patterned first power signal lines to form the second connection line, thereby avoiding interference between the first power signal line and the second connection line. This ensures that both the second connection line and the first power signal line can be set in the second source-drain metal layer on the surface of the first planarization layer facing away from the substrate.

The following describes the technical solutions in the embodiments of the present application in a clear and comprehensive manner, in conjunction with the accompanying drawings of the embodiments. It is evident that the embodiments described herein are just a part of the embodiments of this application, and not all embodiments. Based on the embodiments in this application, all other embodiments obtained by those skilled in the art without creative effort fall within the scope of protection of this application. Furthermore, it should be understood that the specific embodiments described here are only used for explaining and illustrating this application and are not intended to limit the scope of this application. In this application, unless stated otherwise, orientation terms such as "up" and "down" typically refer to the directions when the device is in its actual use or working state, specifically as shown in the direction of the drawings. The terms "inner" and "outer" are in reference to the contours of the device.

The subsequent disclosure provides many different embodiments or examples for implementing different structures of this application. To simplify the disclosure of the present application, the following text describes specific components and settings of particular examples. Of course, these are merely examples and are not intended to limit this application. Furthermore, this application may repeat reference numbers and/or letters in different examples. This repetition is for simplification and clarity, and does not indicate any relationship between the various embodiments and/or setups discussed. Additionally, this application provides examples of various specific processes and materials, but those skilled in the art can recognize the applicability of other processes and/or the use of other materials. The following is a detailed explanation of these embodiments, and it should be noted that the order of description of the following embodiments does not limit the preferred order of the embodiments.

First Embodiment

Figure 2:
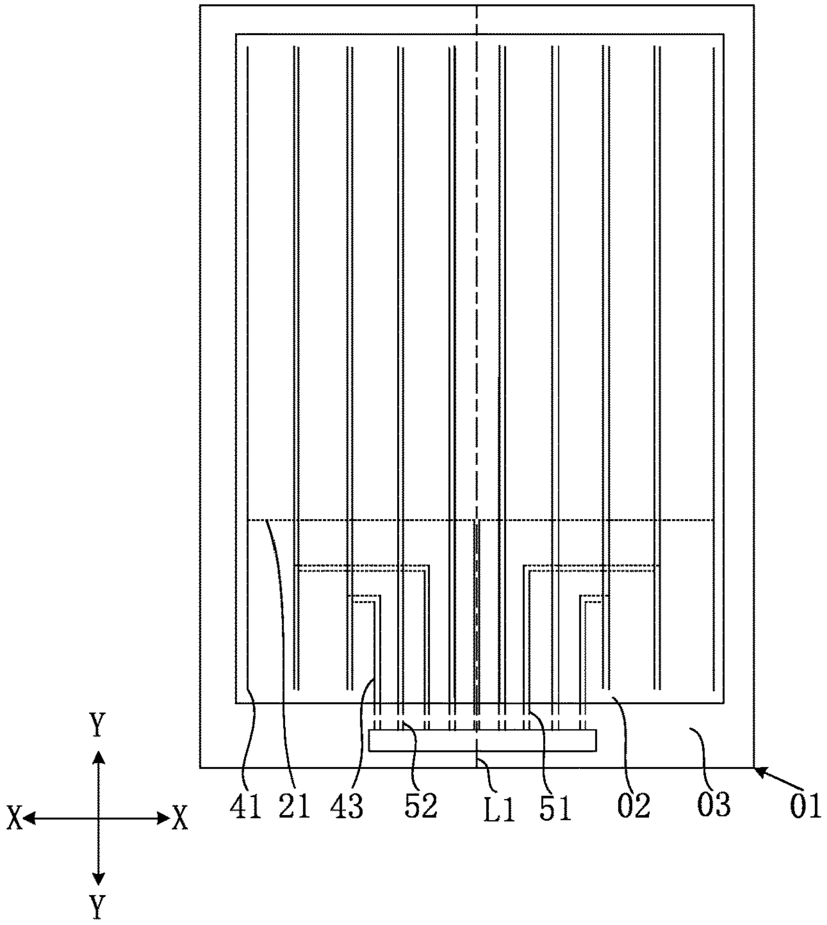
FIG. 2 is a schematic plan view of the display panel according to some embodiments of the present application.
Figure 3:
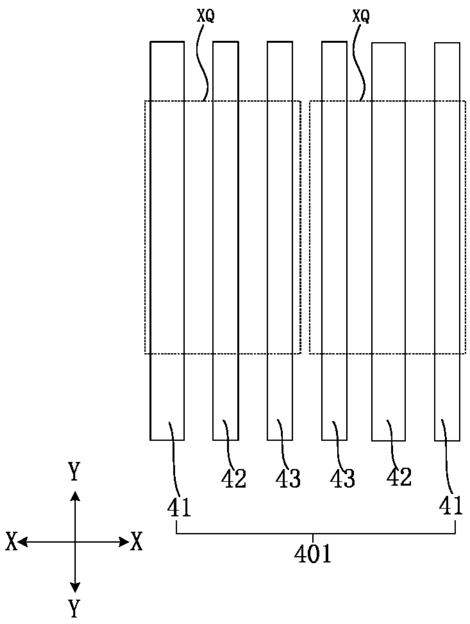
FIG. 3 is a schematic plan distribution view of first power signal lines and second connection lines between two adjacent data lines according to some embodiments of the present application.
Figure 4:
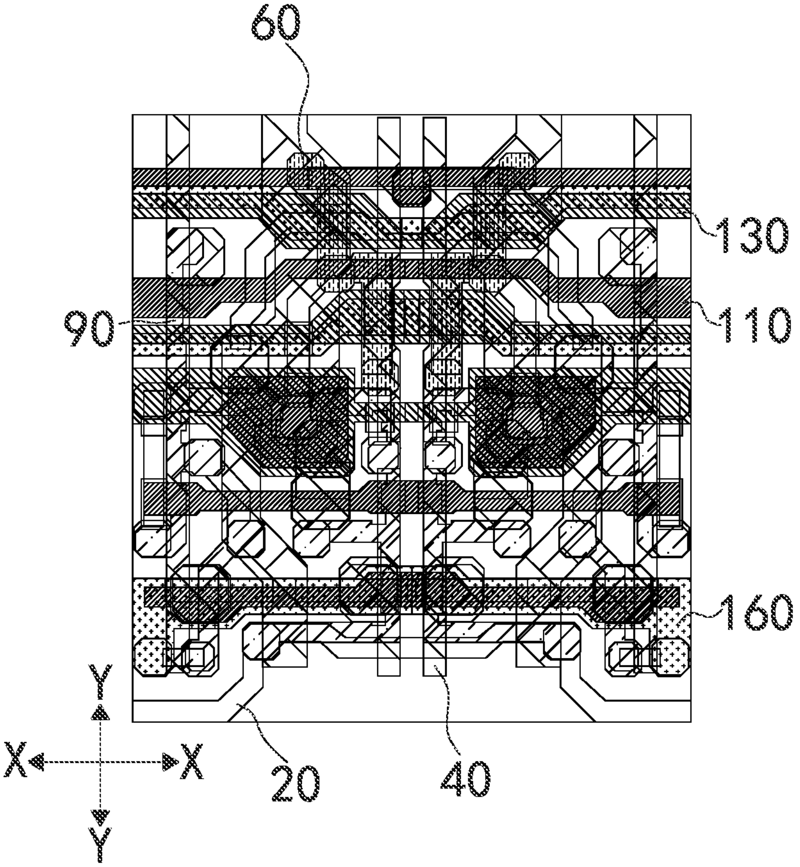
FIG. 4 is a schematic plan view of multiple film layers in an area between two adjacent data lines according to some embodiments of the present application.
Figure 5A:
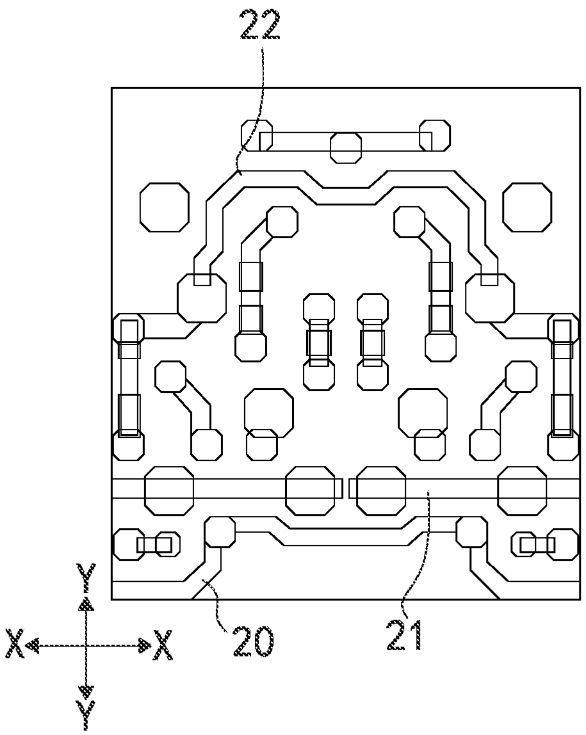
FIG. 5A is a schematic plan view of a first source-drain metal layer in a display area according to some embodiments of the present application.
Figure 5B:
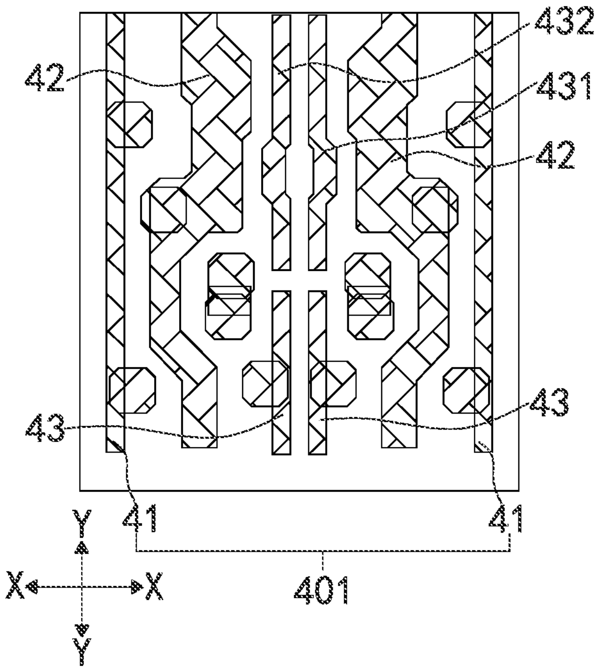
FIG. 5B is a schematic plan view of a second source-drain metal layer in the display area according to some embodiments of the present application.

FIG. 1 is a schematic view of a film layer structure of a display panel according to some embodiments of the present application. FIG. 2 is a schematic plan view of the display panel according to some embodiments of the present application. FIG. 3 is a schematic plan distribution view of first power signal lines and second connection lines between two adjacent data lines according to some embodiments of the present application. FIG. 4 is a schematic plan view of multiple film layers in an area between two adjacent data lines according to some embodiments of the present application. FIG. 5A is a schematic plan view of a first source-drain metal layer in the display area according to some embodiments of the present application. FIG. 5B is a schematic plan view of a second source-drain metal layer in the display area according to some embodiments of the present application. Combining FIGS. 1, 2, 3, 4, 5A, and 5B, a first aspect of this embodiment provides a display panel 01. The display panel 01 includes a display area 02. The display panel 01 includes a substrate 10, a first source-drain metal layer 20, a first planarization layer 30, and a second source-drain metal layer 40. Herein, the first source-drain metal layer 20 is arranged on one side of the substrate 10, and a portion of the first source-drain metal layer 20 located in the display area 02 includes a plurality of first connection lines 21 extending along a first direction X. The first planarization layer 30 is disposed on a surface of the first source-drain metal layer 20, facing away from the substrate 10. The second source-drain metal layer 40 is disposed on a surface of the first planarization layer 30, facing away from the substrate 10. A portion of the second source-drain metal layer 40 located in the display area 02 includes a plurality of data lines 41, a plurality of first power signal lines 42, and a plurality of second connection lines 43, all extending along a second direction Y. One of the second connection lines 43 and one of the data lines 41 are each electrically connected to the same one of the first connection lines 21 through a via hole penetrating the first planarization layer 30. In the display area 02 of the display panel 01, there are two pixel driving circuits XQ set adjacently and symmetrically along the first direction X, each pixel driving circuit XQ being electrically connected to one of the data lines 41. Between the two data lines 41 corresponding to the two pixel driving circuits XQ, there are two first power signal lines 42, and at least one second connection line 43 is disposed between the two first power signal lines 42.

In the display panel 01 provided by the present application, since the portion of the second source-drain metal layer 40 disposed in the display area 02 includes the data lines 41, the first power signal lines 42, and the second connection lines 43, the data lines 41, the first power signal lines 42, and the second connection lines 43 are arranged in the same layer. Moreover, only the first planarization layer 30 separates the second connection lines 43 from the first connection lines 21. This arrangement allows one of the second connection lines 43 and one of the data lines 41 to be electrically connected to the same first connection line 21 through via holes penetrating the first planarization layer 30, thereby forming a Fanout in Active Area (FIAA) architecture and effectively reducing the difficulty of connecting the first connection lines 21 with the second connection lines 43.

Furthermore, the present application involves a patterned design of the first power signal lines 42 between two data lines 41 under a specific pixel architecture. Specifically, this pixel architecture consists of two pixel driving circuits XQ that are adjacent and symmetrically arranged in the first direction X. The two data lines 41 under this specific pixel architecture are electrically connected to the two pixel driving circuits XQ, respectively. The present application forms a gap area between the two data lines 41 corresponding to the two pixel driving circuits XQ, with two first power signal lines 42 in the gap. This allows for the creation of the second connection lines 43 in a gap area between the patterns of the two differentiated first power signal lines 42. This design avoids the interference problem between the first power signal lines 42 and the second connection lines 43. As a result, both the second connection lines 43 and the first power signal lines 42 can be set on the surface of the second source-drain metal layer 40, which is on the side of the first planarization layer 30 facing away from the substrate 10.

Continuing with reference to FIG. 2, in some embodiments of the present application, the data lines 41 in the portion of the second source-drain metal layer 40 disposed in the display area 02 are evenly divided into multiple data line groups 401. Each data line group 401 includes two adjacent data lines 41. In at least one of these data line groups 401, two adjacent first power signal lines 42 are placed between the two data lines 41, and two adjacent second connection lines 43 are positioned between the two first power signal lines 42.

In the display panel 01 of the present application, the layout of the plurality of data lines 41 in the display area 02 is such that they are grouped in pairs, dividing the data lines 41 into a plurality of data line groups 401. Each data line group 401 includes two adjacent data lines 41. This layout of the data lines 41 allows for larger gap spaces between the two adjacent data lines 41 in each data line group 401. Consequently, while meeting the wiring requirements of the first power signal lines 42, a wiring structure can be formed with two adjacent first power signal lines 42, between which are placed two adjacent second connection lines 43. This increases the number of the second connection lines 43 that can be set in the display area 02, thus increasing the fan-out wiring in the display area 02 and further enhancing the ability of the fan-out wiring to optimize edge display.

In some embodiments of the present application, the two data lines 41 in the data line group 401 are arranged symmetrically. The two pixel driving circuits XQ, which are electrically connected to the two data lines 41 in the data line group 401 and are adjacently arranged in the first direction X, are also symmetrically arranged. This arrangement optimizes the layout of the patterns corresponding to the data lines 41 and the pixel driving circuits XQ, allowing for sufficient space between the two adjacent data lines 41 in the data line group 401 to accommodate two adjacent first power signal lines 42 and two adjacent second connection lines 43.

Figure 5C:
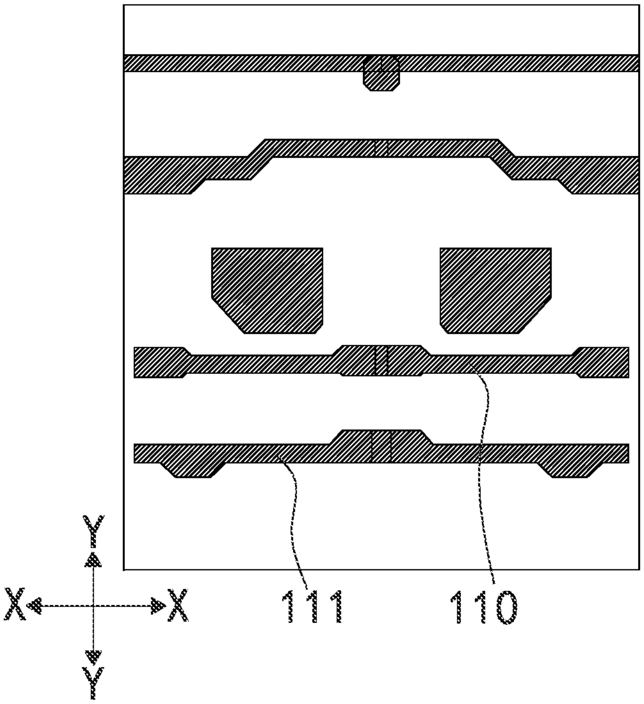
FIG. 5C is a schematic plan view of a first gate layer in the display area according to some embodiments of the present application.
Figure 5D:
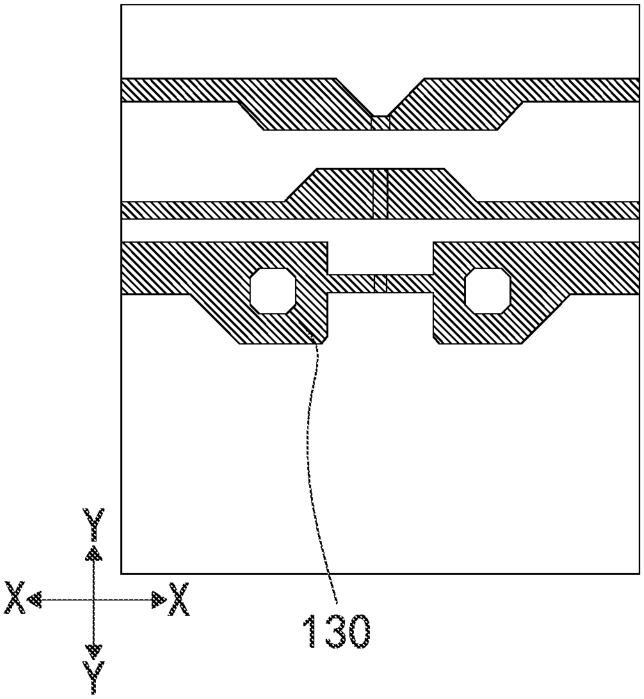
FIG. 5D is a schematic plan view of a second gate layer in the display area according to some embodiments of the present application.
Figure 5E:
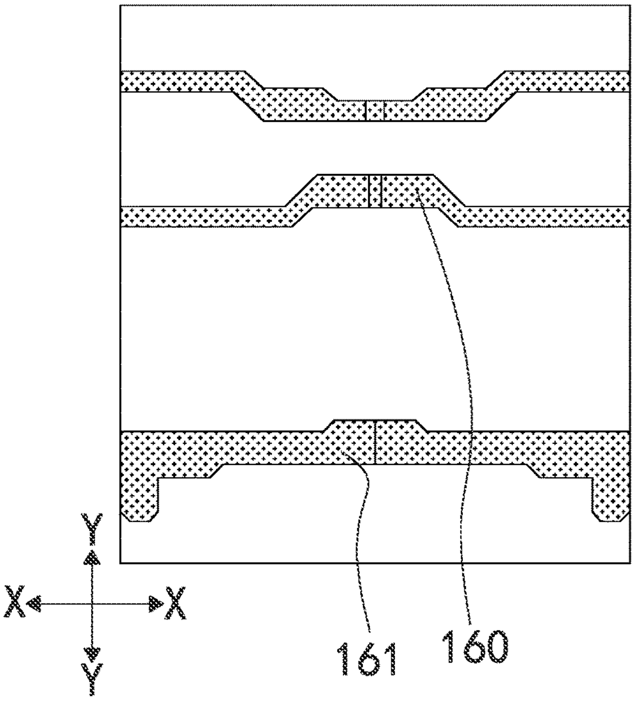
FIG. 5E is a schematic plan view of a third gate layer in the display area according to some embodiments of the present application.

FIG. 5C is a schematic plan view of a first gate layer in the display area in some embodiments of this application. FIG. 5D is a schematic plan view of a second gate layer in the display area in some embodiments of this application. FIG. 5E is a schematic plan view of a third gate layer in the display area in some embodiments of this application. In conjunction with FIGS. 1, 5C, 5D, and 5E, in some embodiments of this application, the display panel 01 includes a non-display area 03 and also includes a gate layer 50. The gate layer 50 is disposed between the substrate 10 and the first source-drain metal layer 20. A portion of the gate layer 50 disposed in the non-display area 03 includes a plurality of first signal lines 51. The data lines 41 are electrically connected to the first signal lines 51 through the first connection lines 21 and the second connection lines 43. In a direction perpendicular to the substrate, a portion of the second source-drain metal layer disposed in the non-display area overlaps at least a part of the first signal lines 51, and a portion of the first source-drain metal layer disposed in the non-display area overlaps at least a part of the first signal lines 51. Additionally, the resistivity of the gate layer 50 is greater than the resistivity of the first source-drain metal layer 20, and the resistivity of the gate layer 50 is greater than the resistivity of the second source-drain metal layer 40.

Referring to FIG. 1, the display panel 01 provided in the present application includes, on one side of the substrate 10, a series of sequentially stacked layers comprising a first gate insulating layer 100, a first gate layer 110, a second gate insulating layer 120, a second gate layer 130, a first interlayer dielectric layer 140, a third gate insulating layer 150, and a third gate layer 160.

In the display panel 01 provided by this application, the gate layer 50 includes at least one of the first gate layer 110, the second gate layer 130, and the third gate layer 160. Optionally, the gate layer 50 comprises both the first gate layer 110 and the second gate layer 130. That is, the first signal lines 51 include parts located in the first gate layer 110 and parts located in the second gate layer 130. This arrangement reduces the wiring complexity of the first signal lines 51. While ensuring safety, it allows the first signal lines 51 to have a smaller spacing between the first signal lines and adjacent second signal lines 52 or other signal lines.

In the display panel 01 provided by this application, in the direction perpendicular to the substrate 10, the portion of the second source-drain metal layer 40 located in the non-display area 03 (such as the first power signal lines 42 in the non-display area 03) overlaps at least partially with the first signal lines 51. Similarly, the portion of the first source-drain metal layer 20 located in the non-display area 03 (such as the wiring parallel to the first power signal line 42 in the non-display area 03) overlaps at least partially with the first signal lines 51. This configuration means that the first signal lines 51, which are electrically connected to the data lines 41, cannot be located in the first source-drain metal layer 20 or the second source-drain metal layer 40. Consequently, the first signal lines 51 need to be disposed in the gate layer 50.

Figure 6A:
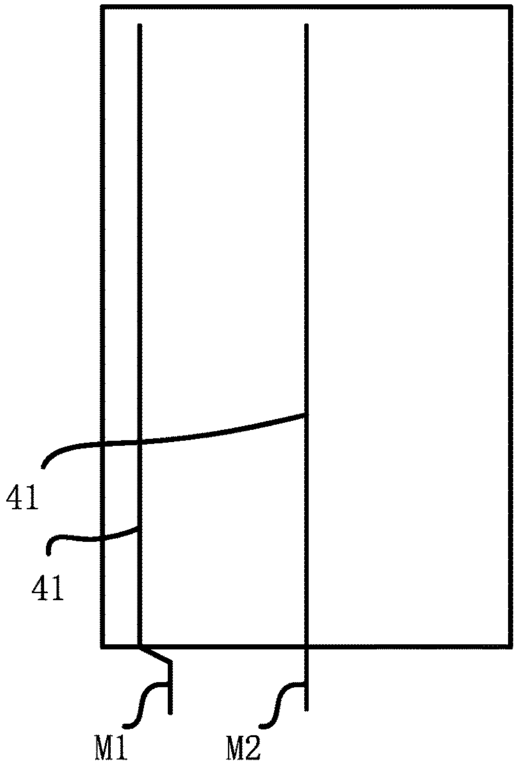
FIG. 6A shows a schematic plan view of the signal lines in an edge region and a middle region in related technology.
Figure 6B:
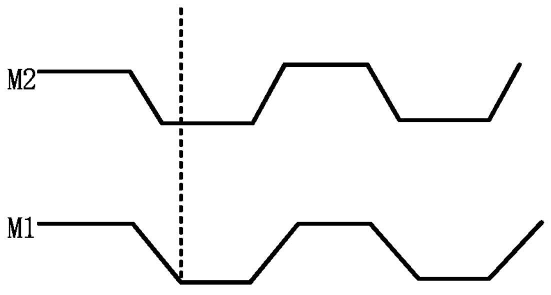
FIG. 6B shows a waveform diagram of data signals output to the corresponding data lines by the signal lines in the edge region and the middle region under a high refresh rate mode in related technology.

Regardless of whether the gate layer 50 is the first gate layer 110, the second gate layer 130, the third gate layer 160, or a combination of these, the resistivity of the gate layer 50 is higher than the resistivity of both the first source-drain metal layer 20 and the second source-drain metal layer 40. This means that the RC (resistance-capacitance) delay during the transmission of electrical signals in the gate layer 50 is relatively large. FIG. 6A shows a schematic plan view of the signal lines in an edge region and a middle region in related technology, and FIG. 6B shows a waveform diagram of data signals output to the corresponding data lines by the signal lines in the edge region and the middle region under a high refresh rate mode in related technology. Referring to FIGS. 6A and 6B, the refresh rate corresponding to the high refresh rate mode, for example, is greater than or equal to 90 HZ. In this high refresh rate mode, the scanning time for each pixel row is compressed, which further highlights the issue of RC delay in the transmission of electrical signals in the gate layer 50. Specifically, since edge region signal lines M1 are longer and middle region signal lines M2 are shorter, the voltages charged into display pixels via the data lines 41 in the edge region and the middle region differ, leading to display anomalies and fine vertical lines in the edge region of the display panel 01. In the display panel 01 provided by the present application, the length of the first signal lines electrically connected to the data lines 41 in the edge region is the same as the length of the second signal lines 52 electrically connected to the data lines 41 in the middle region. The difference between the data lines 41 in the edge region and the middle region lies in whether they are electrically connected to the signal lines in the non-display area 03 through the first connection lines 21 and the second connection lines 43. As mentioned earlier, since the resistivities of both the first source-drain metal layer 20 and the second source-drain metal layer 40 are lower than the resistivity of the gate layer 50, this can reduce the RC delay of the first connection lines 21 and the second connection lines 43, optimizing the display effect of the display panel 01 in the edge region under a high refresh rate mode.

Figure 5F:
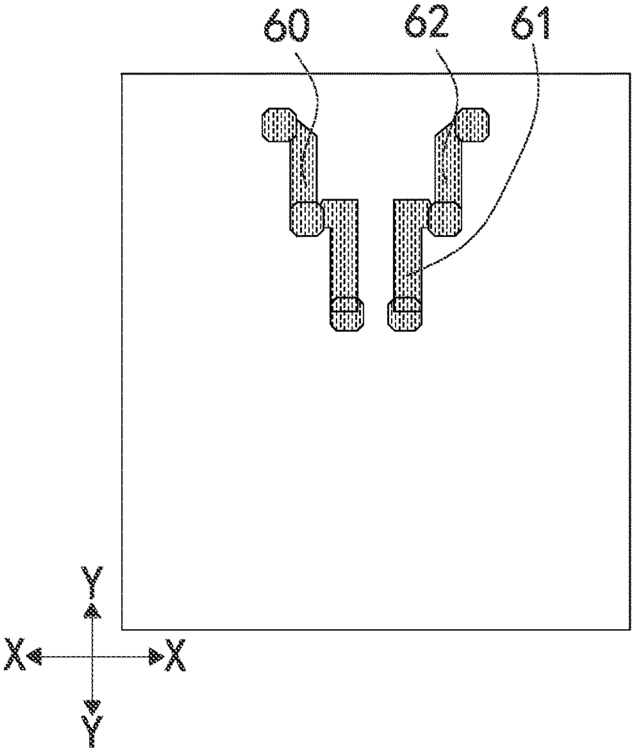
FIG. 5F is a schematic plan view of a metal oxide semiconductor layer in the display area according to some embodiments of the present application.

FIG. 5F is a schematic plan view of a metal oxide semiconductor layer in the display area according to some embodiments of the present application. Referring to FIG. 1 and FIG. 5F, in some embodiments of the present application, the display panel 01 further includes a metal oxide semiconductor layer 60. This metal oxide semiconductor layer 60 is disposed between the substrate 10 and the first source-drain metal layer 20, specifically between the first interlayer dielectric layer 140 and the third gate insulating layer 150. A portion of the metal oxide semiconductor layer 60 disposed in the display area 02 includes a plurality of first active layers 61. The second connection line 43 includes a first part 431 and a second part 432, both extending in the second direction Y. In the direction perpendicular to the substrate 10, at least a part of the first part 431 overlaps with the first active layer 61, while the second part 432 does not overlap with the first active layer 61. In the first direction X, the first part 431 has a first width, and the second part 432 has a second width, with the first width being greater than the second width.

In related technology, the first active layer 61 formed by the metal oxide semiconductor layer 60 exhibits notable photosensitive characteristics. For example, when exposed to white light, the effective field-effect mobility of thin-film transistors (TFTs) associated with the first active layer 61 significantly increases, thereby affecting the switching characteristics of the TFTs associated with the first active layer 61. In the display panel 01 provided by this application, since in the direction perpendicular to the substrate 10, at least a part of the first part 431 overlaps with the first active layer 61, and the second part 432 does not overlap with the first active layer 61, and because in the first direction X, the first part 431 has a first width and the second part 432 has a second width, with the first width being greater than the second width, this arrangement enhances the shielding effect of the second connection line 43 on the first active layer 61. Consequently, it improves the switching characteristics of the TFTs associated with the first active layer 61.

In some embodiments of the present application, the first power signal line 42 forms a notch on the side near the second connection line 43 and at a position corresponding to the first part 431.

In the display panel provided by the present application, the first power signal line 42 forms a notch on the side near the second connection line 43 and at the position corresponding to the first part 431. The function of this notch is to avoid the first part 431, ensuring a sufficient spacing distance between the first power signal line 42 and the second connection line 43, thereby reducing signal crosstalk and improving safety performance. Specifically, since the first part 431 of the second connection line 43 has a greater width in the first direction X compared to the second part 432, the spacing between the first part 431 and the first power signal line 42 in the first direction X would be smaller than the spacing between the second part 432 and the first power signal line 42 if no changes were made to the first power signal line 42. This can lead to signal crosstalk and safety issues. To address this problem, the application provides the notch in the first power signal line 42 on the side near the second connection line 43 at the position corresponding to the first part 431.

In some embodiments of the present application, the portion of the metal oxide semiconductor layer 60 disposed in the display area 02 also includes a plurality of second active layers 62. In the direction perpendicular to the substrate 10, the first power signal line 42 covers the second active layer 62.

In related technology, the second active layer 62 formed by the metal oxide semiconductor layer 60 exhibits notable photosensitive characteristics. For example, when exposed to white light, the effective field-effect mobility of the thin-film transistors (TFTs) associated with the second active layer 62 significantly increases, thereby affecting the switching characteristics of these TFTs associated with the second active layer 62. In the display panel 01 provided by this application, since the first power signal line 42 covers the second active layer 62 in the direction perpendicular to the substrate 10, the first power signal line 42 can shield the second active layer 62. Therefore, the first power signal line 42 serves as a shield for the second active layer 62, consequently improving the switching characteristics of the thin-film transistors associated with the second active layer 62.

Figure 7:
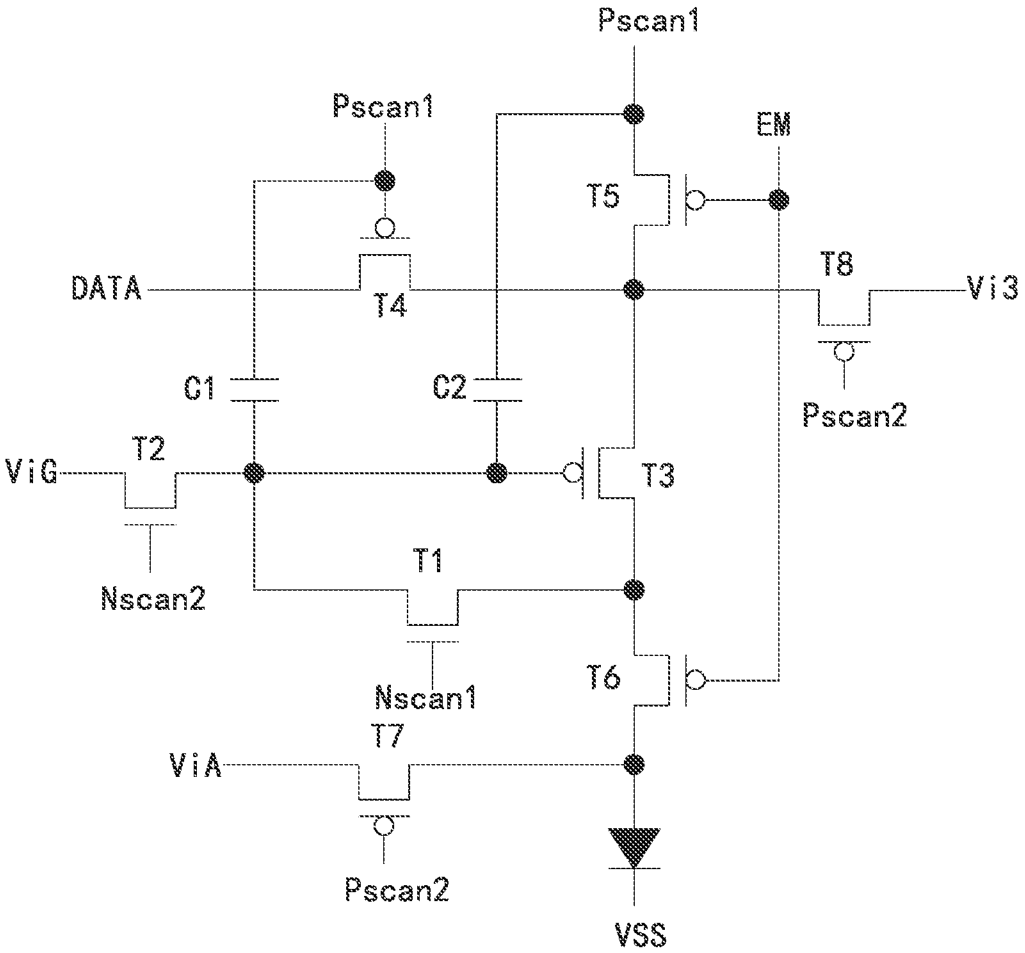
FIG. 7 is an equivalent circuit diagram of a pixel driving circuit in the display area, provided by the embodiments of the present application.

FIG. 7 is an equivalent circuit diagram of the pixel driving circuit in the display area according to the embodiments of the present application. Referring to FIGS. 1 and 7, in some embodiments of this application, the display panel 01 includes a plurality of first thin-film transistors (TFTs) T1 and a plurality of second TFTs T2 set in the display area 02. The first TFT T1 includes the first active layer 61, and the second TFT T2 includes the second active layer 62. One of a source or a drain of the second TFT T2 is electrically connected to a gate reset signal line input terminal ViG, and the other one of the source or the drain of the second TFT T2 is electrically connected to one of a source or a drain of the first TFT T1.

In the display panel 01 provided by the present application, the first TFT T1 includes the first active layer 61, and the second TFT T2 includes the second active layer 62. Both the first active layer 61 and the second active layer 62 are located within the metal oxide semiconductor layer 60. Therefore, both the first TFT T1 and the second TFT T2 are metal oxide thin-film transistors.

Figure 5G:
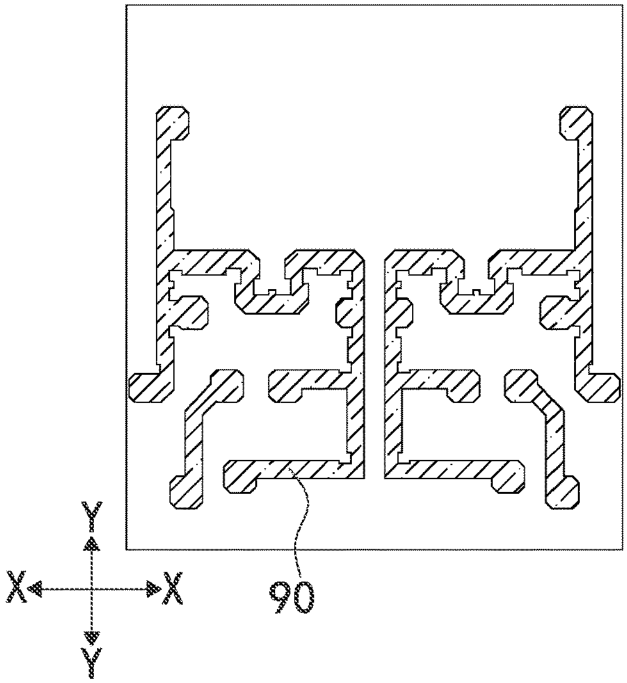
FIG. 5G is a schematic plan view of a low-temperature polysilicon (LTPS) semiconductor layer in the display area according to some embodiments of the present application.

FIG. 5G is a schematic plan view of a low-temperature polysilicon (LTPS) semiconductor layer in the display area according to some embodiments of the present application. Referring to FIGS. 1 and 5G, in some embodiments of this application, the display panel 01 further includes a low-temperature polysilicon semiconductor layer 90. The display panel 01 further includes a plurality of third TFTs T3, a plurality of fourth TFTs T4, a plurality of fifth TFTs T5, a plurality of sixth TFTs T6, a plurality of seventh TFTs T7, and a plurality of eighth TFTs T8 disposed in the display area 02. The low-temperature polysilicon semiconductor layer 90 includes channels of the third TFT T3, fourth TFT T4, fifth TFT T5, sixth TFT T6, seventh TFT T7, and eighth TFT T8. Additionally, sources and drains of the third TFT T3, fourth TFT T4, fifth TFT T5, sixth TFT T6, seventh TFT T7, and eighth TFT T8 are all located in the first source-drain metal layer 20.

In the display panel 01 provided by the present application, the low-temperature polysilicon (LTPS) semiconductor layer 90 includes the channels of the third thin-film transistor (TFT) T3, fourth TFT T4, fifth TFT T5, sixth TFT T6, seventh TFT T7, and eighth TFT T8. In other words, the third TFT T3, fourth TFT T4, fifth TFT T5, sixth TFT T6, seventh TFT T7, and eighth TFT T8 are all low-temperature polysilicon thin-film transistors.

Additionally, since the sources and the drains of the third TFT T3, fourth TFT T4, fifth TFT T5, sixth TFT T6, seventh TFT T7, and eighth TFT T8 in each pixel driving circuit XQ are all located in the first source-drain metal layer 20, there is a need to set up numerous via hole interconnect structures on the first source-drain metal layer 20. This is a significant reason why the difficulty of connecting the first connection line and the second connection line greatly increases in display panels of related technology, especially when there is a third metal layer and at least two insulating layers spacing between the first connection line and the second connection line. In other words, this application manages to address the issue of interference between the first power signal line 42 and the second connection line 43, while also reducing the difficulty of connecting the first connection line 21 and the second connection line 43 in pixel driving circuits XQ that include eight TFTs.

In some embodiments of the present application, the display panel 01 includes pixel driving circuits XQ arranged corresponding to the display pixels. The pixel driving circuit XQ includes the first TFT T1, the second TFT T2, the third TFT T3, the fourth TFT T4, the fifth TFT T5, the sixth TFT T6, the seventh TFT T7, and the eighth TFT T8. This means that the pixel driving circuit XQ incorporates two different types of TFTs. The pixel driving circuit XQ is a Low Temperature Polycrystalline Oxide (LTPO) pixel driving circuit XQ. This configuration allows for a significant improvement in the refresh rate range and driving performance of the display panel 01, while also reducing power consumption.

In some embodiments of this application, the pixel driving circuit XQ additionally includes a first capacitor C1 and a second capacitor C2. The pixel driving circuit XQ also includes various signal input terminals: a data signal input terminal DATA, an anode reset signal input terminal ViA, an enable signal input terminal EM, a first-type first scan signal input terminal Nscan1, a first-type second scan signal input terminal Nscan2, a second-type first scan signal input terminal Pscan1, a second-type second scan signal input terminal Pscan2, a second power signal input terminal VSS, and a third reset signal input terminal Vi3. Among these, the data signal input terminal DATA is electrically connected to the data line 41, the anode reset signal input terminal ViA is electrically connected to an anode reset signal line, the enable signal input terminal EM is electrically connected to an enable signal line, the first-type first scan signal input terminal Nscan1 is electrically connected to one of first-type scan lines, the first-type second scan signal input terminal Nscan2 is electrically connected to another first-type scan line, the second-type first scan signal input terminal Pscan1 is electrically connected to one of second-type scan lines 111, the second-type second scan signal input terminal Pscan2 is typically connected to another second-type scan line 111, the second power signal input terminal VSS is electrically connected to a second power signal line, and the third reset signal input terminal Vi3 is electrically connected to a third reset signal line.

In some embodiments of the present application, the second-type scan line 111, which is electrically connected to the second-type second scan signal input terminal Pscan2, is also electrically connected to a gate of the seventh TFT T7 and a gate of the eighth TFT T8. Additionally, in the direction perpendicular to the substrate 10, the second-type scan line 111 overlaps at least partially with the first connection line 21. Furthermore, the display panel 01 also includes a shielding line 161 disposed between the second-type scan line 111 and the first connection line 21.

In the display panel provided by this application, the signal transmitted by the second-type scan line 111, which is electrically connected to the second-type second scan signal input terminal Pscan2, is different from the signal transmitted by the first connection line 21. Since the second-type scan line 111, which is electrically connected to the second-type second scan signal input terminal Pscan2, overlaps at least partially with the first connection line 21, a coupling capacitance is generated between these two lines during the operation of the display panel 01. The coupling capacitance can adversely affect the display quality of the display panel 01. To address this issue, the present application includes a shielding line 161 disposed between the second-type scan line 111, which is connected to the second-type second scan signal input terminal Pscan2, and the first connection line 21. This effectively mitigates the crosstalk problem between the second-type scan line 111 and the first connection line 21, thereby enhancing the display performance of the display panel 01.

In some embodiments of the present application, the second-type scan line 111, which is electrically connected to the second-type second scan signal input terminal Pscan2, is located in the first gate layer 110, while the shielding line 161 is situated in the third gate layer 160.

In some embodiments of the present application, a width of the shielding line 161 in the second direction Y is greater than widths of both the second-type scan line 111, which is electrically connected to the second-type second scan signal input terminal Pscan2, and the first connection line 21 in the second direction Y.

In the display panel provided by the present application, the shielding effect of the shielding line 161 is further enhanced due to its width in the second direction Y being greater than the widths of both the second-type scan line 111 and the first connection line 21 in the second direction Y. As a result, this design further enhances the shielding effect of the shielding line 161. Consequently, it further improves the mitigation of crosstalk issues between the second-type scan line 111 and the first connection line 21.

In some embodiments of the present application, the second connection line 43, in its orthographic projection onto the substrate 10, covers the orthographic projections of both the sixth TFT T6 and the seventh TFT T7 on the substrate 10.

Additionally, in some embodiments of the present application, the first source-drain metal layer 20 also includes a parallel signal line 22. The parallel signal line 22 is connected in parallel with the first power signal line 42.

In the display panel provided by this application, when at least one second connection line 43 is placed between two adjacently set first power signal lines 42, such configuration prevents the first power signal lines 42 from forming a large-area block structure. Such a large-area block structure would reduce the signal transmission efficiency of the first power signal lines 42. To address this issue, the present application introduces a parallel signal line 22 formed in the first source-drain metal layer 20, which runs in parallel with the first power signal line 42. This design effectively reduces the resistance of the first power signal line 42 without affecting the layout of other component circuits, thereby enhancing the signal transmission efficiency of the first power signal line 42.

In some embodiments of the present application, an area proportion of the parallel signal line 22 in the first source-drain metal layer 20 is greater than an area proportion of the first connection line 21 in the first source-drain metal layer 20.

In the display panel of the present application, because the area occupied by the parallel signal line 22 in the first source-drain metal layer 20 is larger in proportion than the area of the first connection line 21 in the first source-drain metal layer 20, it effectively ensures a sufficient area for the parallel signal line 22, which in turn enhances capability of the parallel signal line 22 to reduce the resistance of the first power signal line 42, thereby improving the signal transmission efficiency of the first power signal line 42.

In some embodiments of this application, the resistivity of the second source-drain metal layer 40 is lower than the resistivity of the first source-drain metal layer 20.

In related technologies, the materials used for both the first source-drain metal layer 20 and the second source-drain metal layer 40 are the same, and consequently, their resistivities are also the same. However, the applicant has identified that in the architecture of the display panel 01, when at least one second connection line 43 is disposed between two adjacently placed first power signal lines 42, it prevents the first power signal lines 42 from forming a large block-like structure. Given that the first power signal line 42 has a high requirement for signal transmission efficiency, to further enhance the signal transmission efficiency of the first power signal line 42, this application makes the resistivity of the second source-drain metal layer 40 lower than the resistivity of the first source-drain metal layer 20. In other words, a material with higher electrical conductivity than the electrical conductivity of the first source-drain metal layer 20 is used to form the first power signal line 42 in the second source-drain metal layer 40. Optionally, the first power signal line 42 can be a VDD power signal line.

In some embodiments of this application, the display panel 01 further includes a buffer layer 80. This buffer layer 80 is disposed between the substrate 10 and the low-temperature polysilicon (LTPS) semiconductor layer 90.

Furthermore, in some embodiments, the display panel 01 includes a second interlayer dielectric layer 170. The second interlayer dielectric layer 170 is situated on one side of the third gate layer 160 that faces away from the substrate 10. The first source-drain metal layer 20 is positioned on one side of the second interlayer dielectric layer 170 that faces away from the substrate 10.

In some embodiments of the present application, the display panel 01 further includes a second planarization layer 180, an anode layer 190, a pixel defining layer 200, and a spacer layer 210. The second planarization layer 180 is disposed on one side of the second source-drain metal layer 40 that faces away from the substrate 10. The anode layer 190 is disposed on one side of the second planarization layer 180 that faces away from the substrate 10. The pixel defining layer 200 is disposed on one side of the anode layer 190 that is away from the substrate 10. The spacer layer 210 is placed on one side of the pixel defining layer 200 that faces away from the substrate 10. Optionally, the pixel defining layer 200 and the spacer layer 210 can be integrally formed.

In some embodiments of the present application, a vertical bisecting line L1 is defined, extending along the second direction Y. This vertical bisecting line L1 divides the display area 02 into two symmetric parts along the first direction X. In this setup, when two of the second connection lines 43, which are between two data lines 41 in the data line group 401, are located on opposite sides of the vertical bisecting line L1, a distance between the data line 41 that is electrically connected to one of these second connection lines 43 and the data line 41 electrically connected to the other second connection line 43 is greater than a distance between the two data lines 41 in the data line group 401. When both the second connection lines 43 between two data lines 41 in the data line group 401 are on the same side of the vertical bisecting line L1, a distance between the data line 41 connected to one of the second connection lines 43 and the data line 41 electrically connected to the other second connection line 43 is smaller than the distance between the two data lines 41 in the data line group 401.

In a second aspect, the embodiments of this application provide a display device that includes a housing and the display panel 01 as described in any of the aforementioned embodiments. The housing features an accommodation space, within which the display panel 01 is positioned.

Second Embodiment

Figure 8:
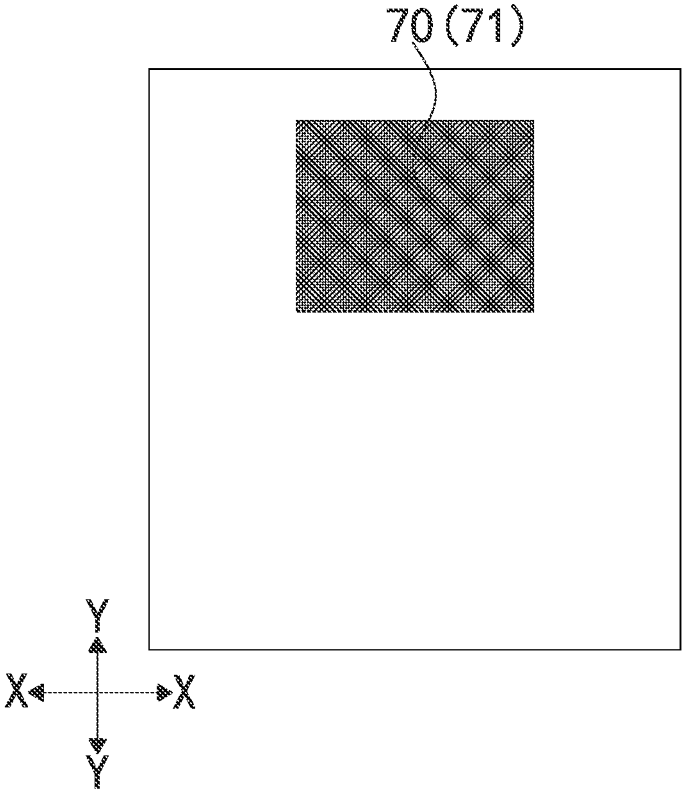
FIG. 8 is a schematic plan view of a light-blocking metal layer in some embodiments provided by the present application.

FIG. 8 illustrates a plan structure of a light-blocking metal layer in some embodiments of this application. Combining FIGS. 1 through 8, in the first aspect, the embodiments provide a display panel 01, which has a display area 02. The display panel 01 includes a substrate 10, a first source-drain metal layer 20, a first planarization layer 30, and a second source-drain metal layer 40. In this arrangement, the first source-drain metal layer 20 is placed on one side of the substrate 10, and a portion of the first source-drain metal layer 20 in the display area 02 includes a plurality of first connection lines 21 which extend along a first direction X. The first planarization layer 30 is set on a surface of the first source-drain metal layer 20, on a side facing away from the substrate 10. The second source-drain metal layer 40 is positioned on a surface of the first planarization layer 30, on a side facing away from the substrate 10. A portion of the second source-drain metal layer 40 in the display area 02 includes a plurality of data lines 41, a plurality of first power signal lines 42, and a plurality of second connection lines 43. The data lines 41, the first power signal lines 42, and the second connection lines 43 all extend in a second direction Y. One of the second connection lines 43 and one of the data lines 41 are electrically connected to the same first connection line 21 through via holes penetrating the first planarization layer 30. The display panel 01 in the display area 02 includes two pixel driving circuits XQ which are adjacently and symmetrically set in the first direction X. Each pixel driving circuit XQ is electrically connected to one of the data lines 41. Between the two data lines 41 corresponding to the two pixel driving circuits XQ, there are two first power signal lines 42, and at least one second connection line 43 is disposed between the two first power signal lines 42.

It should be noted that the structure of the display panel 01 provided in the second embodiment is similar to the structure of the display panel 01 provided in the first embodiment. For the parts that are the same, the second embodiment will not repeat the details.

In some embodiments of this application, the display panel 01 also includes a light-blocking metal layer 70. This light-blocking metal layer 70 is positioned on one side of the second source-drain metal layer 40 that faces away from the substrate 10. The light-blocking metal layer 70 includes a plurality of light-blocking sections 71, and each of these light-blocking sections 71 is electrically connected to two adjacently set first power signal lines 42. Furthermore, an orthographic projection of each light-blocking section 71 onto the second source-drain metal layer 40 covers both the first active layer 61 and the second active layer 62.

In the display panel 01 provided by the present application, since each light-blocking section 71 in the light-blocking metal layer 70 is electrically connected to two adjacently set first power signal lines 42, and the orthographic projection of each light-blocking section 71 onto the second source-drain metal layer 40 covers both the first active layer 61 and the second active layer 62, the following effects are achieved: on one hand, the light-blocking sections 71 can parallel the first power signal lines 42, thereby reducing the resistance of the first power signal lines 42; on the other hand, the light-blocking sections 71 also serve to cover both the first active layers 61 and the second active layers 62, consequently enhancing the switching characteristics of the thin-film transistors associated with the first active layer 61 and improving the switching characteristics of the thin-film transistors associated with the second active layer 62.

In the second aspect, the preset application provides a display device. The display device includes a housing and the display panel 01 as described in any of the aforementioned embodiments. The housing includes an accommodation space, within which the display panel 01 is installed.

In summary, the application provides a display panel that includes a display area. The display panel includes a substrate, a first source-drain metal layer, a first planarization layer, and a second source-drain metal layer. The first source-drain metal layer is disposed on one side of the substrate, and a portion of the first source-drain metal layer within the display area includes multiple first connection lines extending in a first direction. The first planarization layer is disposed on a surface of the first source-drain metal layer, facing away from the substrate. The second source-drain metal layer is positioned on a surface of the first planarization layer, facing away from the substrate. In the display area, the second source-drain metal layer includes multiple data lines, multiple first power signal lines, and multiple second connection lines. The data lines, the first power signal lines, and the second connection lines all extend in a second direction, with one of the second connection lines and one of the data lines being electrically connected to the same first connection line through via holes penetrating the first planarization layer. The display panel in the display area includes two pixel driving circuits that are adjacently and symmetrically set in the first direction, with each pixel driving circuit electrically connected to one data line. Between the two data lines corresponding to the two pixel driving circuits, there are two first power signal lines, and at least one second connection line is disposed between these two first power signal lines. In the display panel provided by this application, as the portion of the second source-drain metal layer in the display area includes multiple data lines, multiple first power signal lines, and multiple second connection lines, these lines are arranged in the same layer, with only the first planarization layer separating the second connection lines from the first connection lines. This arrangement allows one of the second connection lines and one of the data lines to be electrically connected to the same first connection line, thereby forming a Fanout in Active Area (FIAA) architecture and effectively reducing the difficulty in connecting the first connection line and the second connection line. Additionally, this application employs a patterned design for the first power signal lines between two data lines under a specific pixel architecture. The specific pixel architecture consists of two pixel driving circuits that are adjacently and symmetrically set in the first direction, wherein the two pixel driving circuits are respectively electrically connected to the two data lines under the specific pixel architecture. By forming two first power signal lines between the two data lines corresponding to the two pixel driving circuits, this application utilizes a gap between the patterned first power signal lines to form the second connection line, thereby avoiding interference between the first power signal line and the second connection line. This ensures that both the second connection line and the first power signal line can be set in the second source-drain metal layer on the surface of the first planarization layer facing away from the substrate.

The detailed description provided above elaborates on a display panel and a display device as per the embodiments of the present application. Specific examples have been used in this disclosure to explain the principles and implementation methods of this application. The descriptions of these embodiments are intended solely to assist in understanding the methods of this application and its core concepts. At the same time, for those skilled in the art, changes in specific implementation methods and application scopes may arise based on the ideas of this application. In summary, the content of this specification should not be construed as limiting the scope of this application.

What is claimed is:

1. A display panel, comprising a display area, wherein the display panel comprises:

a substrate;

a first source-drain metal layer, disposed on one side of the substrate, wherein a portion of the first source-drain metal layer located in the display area comprises a plurality of first connection lines, and the first connection lines extend in a first direction;

a first planarization layer, disposed on a surface of the first source-drain metal layer and facing away from the substrate; and a second source-drain metal layer, disposed on a surface of the first planarization layer and facing away from the substrate, wherein a portion of the second source-drain metal layer located in the display area comprises a plurality of data lines, a plurality of first power signal lines, and a plurality of second connection lines; the data lines, the first power signal lines, and the second connection lines all extend in a second direction; one of the second connection lines and one of the data lines are electrically connected to the same one of the first connection lines through via holes penetrating the first planarization layer;

wherein the display panel comprises two pixel driving circuits in the display area, the two pixel driving circuits are adjacently and symmetrically arranged in the first direction, and each of the pixel driving circuits is electrically connected to one of the data lines;

wherein between the two data lines corresponding to the two pixel driving circuits, two first power signal lines are disposed, and at least one of the second connection lines is disposed between the two first power signal lines.

2. The display panel as claimed in claim 1, wherein the data lines in the portion of the second source-drain metal layer disposed in the display area are evenly divided into a plurality of data line groups, and each of the data line groups comprises two adjacent data lines;

wherein in at least one of the data line groups, two adjacent first power signal lines are disposed between the two data lines, and two adjacent second connection lines are disposed between the two first power signal lines.

3. The display panel as claimed in claim 2, wherein the display panel comprises a non-display area and further comprises:

a gate layer, disposed between the substrate and the first source-drain metal layer, wherein a portion of the gate layer disposed in the non-display area includes a plurality of first signal lines, and the data lines are electrically connected to the first signal lines through the first connection lines and the second connection lines;

wherein in a direction perpendicular to the substrate, a portion of the second source-drain metal layer disposed in the non-display area overlaps at least partially with the first signal lines, and a portion of the first source-drain metal layer disposed in the non-display area overlaps at least partially with the first signal lines; and a resistivity of the gate layer is greater than a resistivity of the first source-drain metal layer, and the resistivity of the gate layer is greater than a resistivity of the second source-drain metal layer.

4. The display panel as claimed in claim 2, further comprising: a metal oxide semiconductor layer, disposed between the substrate and the first source-drain metal layer, wherein a portion of the metal oxide semiconductor layer disposed in the display area comprises a plurality of first active layers;

the second connection line comprises a first part and a second part, both the first part and the second part extending in the second direction; in a direction perpendicular to the substrate, at least a portion of the first part overlaps with the first active layer, while the second part avoids overlapping with the first active layer; and in the first direction, the first part possesses a first width, and the second part possesses a second width, with the first width being greater than the second width.

5. The display panel as claimed in claim 4, wherein the first power signal line is provided with a notch on one side close to the second connection line and at a position corresponding to the first part.

6. The display panel as claimed in claim 4, wherein the portion of the metal oxide semiconductor layer disposed in the display area further comprises a plurality of second active layers, wherein in the direction perpendicular to the substrate, the first power signal lines cover the second active layers.

7. The display panel as claimed in claim 6, further comprising:

a light-blocking metal layer, disposed on one side of the second source-drain metal layer facing away from the substrate;

wherein the light-blocking metal layer comprises a plurality of light-blocking sections, each of the light-blocking sections is electrically connected to two adjacent ones of the first power signal lines, and an orthographic projection of the light-blocking sections projected onto the second source-drain metal layer covers both the first active layers and the second active layers.

8. The display panel as claimed in claim 6, further comprising a plurality of first thin-film transistors and a plurality of second thin-film transistors disposed in the display area, wherein the first thin-film transistors comprise the first active layers, and the second thin-film transistors comprise the second active layers, wherein one of a source or a drain of each second thin-film transistor is electrically connected to a gate reset signal line, and the other one of a source or a drain of each second thin-film transistor is electrically connected to one of a source or a drain of one of the first thin-film transistors.

9. The display panel as claimed in claim 8, further comprising a low-temperature polysilicon (LTPS) semiconductor layer, and disposed in the display area, a plurality of third thin-film transistors, a plurality of fourth thin-film transistors, a plurality of fifth thin-film transistors, a plurality of sixth thin-film transistors, a plurality of seventh thin-film transistors, and a plurality of eighth thin-film transistors, wherein the LTPS semiconductor layer comprises channels of the third thin-film transistors, channels of the fourth thin-film transistors, channels of the fifth thin-film transistors, channels of the sixth thin-film transistors, channels of the seventh thin-film transistors, and channels of the eighth thin-film transistors; and sources and drains of the third, thin-film transistors, the fourth thin-film transistors, the fifth thin-film transistors, the sixth thin-film transistors, the seventh thin-film transistors, and the eighth thin-film transistors are all located in the first source-drain metal layer.

10. The display panel as claimed in claim 9, further comprising a second-type scan line that is electrically connected to a gate of the seventh thin-film transistor and a gate of the eighth thin-film transistor, wherein in the direction perpendicular to the substrate, at least a portion of the second-type scan line overlaps with the first connection line, and wherein the display panel further comprises a shielding line disposed between the second-type scan line and the first connection line.

11. The display panel as claimed in claim 10, wherein a width of the shielding line in the second direction is greater than widths of both the second-type scan line and the first connection line in the second direction.

12. The display panel as claimed in claim 9, wherein an orthographic projection of the second connection line projected onto the substrate covers orthographic projections of both the sixth thin-film transistor and the seventh thin-film transistors projected on the substrate.

13. The display panel as claimed in claim 1, wherein the first source-drain metal layer further comprises a parallel signal line, and the parallel signal line is connected in parallel with the first power signal line.

14. The display panel as claimed in claim 13, wherein an area proportion of the parallel signal line in the first source-drain metal layer is greater than an area proportion of the first connection line in the first source-drain metal layer.

15. The display panel as claimed in claim 1, wherein a resistivity of the second source-drain metal layer is less than a resistivity of the first source-drain metal layer.

16. A display device, comprising a housing and a display panel, wherein the housing comprises an accommodation space, the display panel is disposed in the accommodation space, and the display panel comprises a display area, wherein the display panel comprises:

a substrate;

a first source-drain metal layer, disposed on one side of the substrate, wherein a portion of the first source-drain metal layer located in the display area comprises a plurality of first connection lines, and the first connection lines extend in a first direction;

a first planarization layer, disposed on a surface of the first source-drain metal layer and facing away from the substrate; and a second source-drain metal layer, disposed on a surface of the first planarization layer and facing away from the substrate, wherein a portion of the second source-drain metal layer located in the display area comprises a plurality of data lines, a plurality of first power signal lines, and a plurality of second connection lines; the data lines, the first power signal lines, and the second connection lines all extend in a second direction; one of the second connection lines and one of the data lines are electrically connected to the same one of the first connection lines through via holes penetrating the first planarization layer;

wherein the display panel comprises two pixel driving circuits in the display area, the two pixel driving circuits are adjacently and symmetrically arranged in the first direction, and each of the pixel driving circuits is electrically connected to one of the data lines;

wherein between the two data lines corresponding to the two pixel driving circuits, two first power signal lines are disposed, and at least one of the second connection lines is disposed between the two first power signal lines.

17. The display device as claimed in claim 16, wherein the data lines in the portion of the second source-drain metal layer disposed in the display area are evenly divided into a plurality of data line groups, and each of the data line groups comprises two adjacent data lines;

wherein in at least one of the data line groups, two adjacent first power signal lines are disposed between the two data lines, and two adjacent second connection lines are disposed between the two first power signal lines.

18. The display device as claimed in claim 17, wherein the display panel comprises a non-display area and further comprises:

a gate layer, disposed between the substrate and the first source-drain metal layer, wherein a portion of the gate layer disposed in the non-display area includes a plurality of first signal lines, and the data lines are electrically connected to the first signal lines through the first connection lines and the second connection lines;

wherein in a direction perpendicular to the substrate, a portion of the second source-drain metal layer disposed in the non-display area overlaps at least partially with the first signal lines, and a portion of the first source-drain metal layer disposed in the non-display area overlaps at least partially with the first signal lines; and a resistivity of the gate layer is greater than a resistivity of the first source-drain metal layer, and the resistivity of the gate layer is greater than a resistivity of the second source-drain metal layer.

19. The display device as claimed in claim 17, further comprising: a metal oxide semiconductor layer, disposed between the substrate and the first source-drain metal layer, wherein a portion of the metal oxide semiconductor layer disposed in the display area comprises a plurality of first active layers;

the second connection line comprises a first part and a second part, both the first part and the second part extending in the second direction; in a direction perpendicular to the substrate, at least a portion of the first part overlaps with the first active layer, while the second part avoids overlapping with the first active layer; and in the first direction, the first part possesses a first width, and the second part possesses a second width, with the first width being greater than the second width.

20. The display device as claimed in claim 19, wherein the portion of the metal oxide semiconductor layer disposed in the display area further comprises a plurality of second active layers, wherein in the direction perpendicular to the substrate, the first power signal lines cover the second active layers.

* * * * *